United States Patent [19]

Latham et al.

[11] Patent Number: 4,822,718

[45] Date of Patent: Apr. 18, 1989

[54] LIGHT ABSORBING COATING

[75] Inventors: William J. Latham; Terry L. Brewer; Jeffry Hunninghake, all of Rolla, Mo.

[73] Assignee: Brewer Science, Inc., Rolla, Mo.

[21] Appl. No.: 825,855

[22] Filed: Feb. 4, 1986

[51] Int. Cl.$^4$ .............................................. G03C 1/76
[52] U.S. Cl. .................................... 430/271; 430/521; 430/522; 430/512
[58] Field of Search ................ 430/271, 521, 522, 512

[56] References Cited

U.S. PATENT DOCUMENTS

| | | | |
|---|---|---|---|
| 2,791,504 | 5/1957 | Plambeck | 430/271 |
| 2,892,716 | 6/1959 | Martin | 96/115 |
| 4,064,113 | 12/1977 | D'Alelio | 524/84 X |
| 4,102,683 | 7/1978 | DiPiazza | 96/384 |
| 4,230,939 | 10/1980 | de Bont et al. | 430/945 |
| 4,242,437 | 12/1980 | Rohloff | 430/271 |
| 4,357,416 | 11/1982 | Fan | 430/302 |
| 4,362,809 | 12/1982 | Chen et al. | 430/312 |
| 4,370,906 | 1/1983 | O'Toole et al. | 430/312 |
| 4,376,162 | 3/1983 | Kawata et al. | 430/510 |

OTHER PUBLICATIONS

R. Rubner et al, "A Photopolymer–The Direct Way to Polyimide Patterns", Photographic Science and Engineering, vol. 23, No. 5, 1979, pp. 303–309.

P. Tschopp, "Use of UV-Absorbers", No. 22217, Research Disclosure, Oct. 1982; p. 327.

Fok, Society of Photographic Scientists and Engineers, Inc. Seminar, 1968, pp. 116–131.

Listran, Swanson, Walland and Campbell, SPIE Society of Photo-Optical Instrumentation Engineers Conf., Santa Clara, CA, Mar. 1984.

Hackh's Chemical Dictionary, Third Edition, 1944, pp. 132, 230.

Lin, Purdes, Saller and Hunter, International Electron Device Meeting, San Francisco, CA, Dec. 1982, p. 399.

Potter et al, Engineering Reports, No. 5, p. 1, May 1984.

R. D. Coyne and A. J. Brewer, Kodak Microelectronics Seminar, San Diego, CA, Nov. 1983.

Brewer, Carlson and Arnold, Journal of Applied Photographic Engineering, vol. 7, No. 6, Dec. 1981.

Ting and Liguw, SPIE Society of Photo-Optical Instrumentation Engineers Conf., Santa Clara, CA, Mar. 1984.

O'Toole, Liu and Chang, IEEE Transactions on Electron Devices, Edition 2a, No. 11, Nov. 1981, pp. 1405–1410.

Chang, E. D. Liu, and M. M. O'Toole, 1981 Symposium on VLSI Technology, Digest of Technical Papers, Maui, HI, Sep. 1981.

A. O. Weiss, Semiconductor International, Apr. 1983, p. 82.

K. Harrison and C. Takemoto, Kodak Microelectronics Seminar, San Diego, CA, Nov. 1983.

Burggraaf, Semiconductor International, vol. 66, Feb. 1984.

Lin, Marriot, Orvek and Fuller, SPIE Society of Photo-Optical Instrumentation Engineers Conf., Santa Clara, CA, Mar. 1984.

Carlson and Arnold, Kodak '80 Interface, Oct. 1980, pp. 109–113.

Punyakumleard et al, ACS National Meeting, St. Louis, MO, Apr. 1984.

Y. C. Lin, Sue Jones, G. Fuller, IEEE, Los Angeles, CA, May 1983, Apr. 1984.

P. Burggraaf, Semiconductor International, Nov. 1983.

Primary Examiner—Paul R. Michl
Assistant Examiner—Cynthia Hamilton
Attorney, Agent, or Firm—Cohn, Powell & Hind

[57] ABSTRACT

A broad spectrum light absorbing medium to be coated over photosensitive layers, such as a photoresist for integrated circuit "chips" to act as a true surface for autofocus of the camera used to expose the photoresist. The product may also be used where a light impermeable, high contrast or black coating is needed, such as, in liquid crystal displays and light emitting diodes, photodiodes, solid state lasers, or patterning apertures on light-wave modulators. The coating absorbs light from 200 to 1000 nanometers. The coating has a polymer vehicle which can form a tightly adhering, thin, smooth and uniform coating. The coating includes a light absorbing dye. This light absorbing layer may be imageable.

20 Claims, No Drawings

LIGHT ABSORBING COATING

This is a continuation-in-part of U.S. patent application Ser. No. 638,258 filed Aug. 6, 1984 and is a continuation-in-part of U.S. patent application Ser. No. 431,798 filed Sept. 30, 1982. Application Ser. No. 638,258 is a divisional application of application Ser. No. 431,709. The disclosures of these two applications are incorporated by reference herein.

BACKGROUND AND SUMMARY OF THE INVENTION

In recent years many electronic devices have been developed which emit or in someway modulate light. Because of these developments a need has arisen for a black coating which can be patterned by any of the several processes common in the microelectronics industry. This black coating may either be used to protect light sensitive areas of a device from light or to enhance contrast between light emitting or reflecting areas on a device and those areas which should appear darker. The polymer coating must do much more than merely absorb light. Black paint for example could not be used. The coating should be patternable preferably by a process already used in the industry. One process involves coating positive photoresist exposing it to light and developing the photoresist and an underlying layer in hydroxide solution. This basic process is called a wet process or a wet etch. Another process involves coating resist on a substrate patterning the resist, etching the substrate and then etching a sublayer under the substrate using a plasma or a reactive ion etch. This is called a dry etch in the art. Another requirement of the coating is that the polymer coating should have dielectric properties. As a part of an electrical device it should have a high dielectric strength and a high resistivity. A third requirement is that the coating should be uniform. It should adhere well to common substrates such as silicon oxide and aluminum. The coating should be a strong absorber of light at the wavelengths of interest and it should high thermal stability and it should be durable. Also, the film thickness must be compatible with the thickness of the electrical device while still providing sufficient light attenuation.

In the art one material currently sold by Polytronics of Richardson, Tex. attempts to meet some of the above requirements but does not meet all of them. It contains a polymer solution filled with finely ground carbon. The polymer used is polyimide which imparts thermal stability but the material can be patterned only by a wet process, it cannot be dry etched. The material has extremely low resistivity and is thus not compatible with many electronic devices. Moreover the film is not uniform due to the carbon particles and light absorption per unit of film thickness is very low. The art has attempted to solve the problem of protecting light sensitive areas of a device in other ways including by depositing an insulating layer on the device and patterning a metal on top of the insulating layer. The metal shields portions of the device from light. However, this process is very time consuming and more expensive than using an opaque organic film. In addition many users do not like this system since they do not wish to reflect light because of affects on peripheral light sensitive devices or because the appearance of a very shiny surface is not satisfactory in their device. A further way of enhancing contrast in the art has been to deposit an anti-reflection layer such as an indium-tin-oxide on a part of the device which should appear optically darker. These layers are very limited in that they work only over a relatively narrow band of wavelengths and they require a more complex and longer process and are difficult to rework.

One final approach which the art has used has been to use a filter which is overlaid on the device that is, the filter is not deposited directly on the device. Due to the size and geometry of the filter and the complexity of the filter patterns these devices are limited due to problem of aligning the filter precisely with the underlying device.

Applicants' invention solves the problems of the prior art by using preferably a polymer precursor and soluble dyes which form the uniform containing this film with extremely good insulating properties, good adhesion properties, wet and dry development characteristics with a photoresist system and a very high light absorbance in a desired wavelength range from ultraviolet through the visible and through the infrared spectrum. Applicants' coating material has a film thickness compatible with electronic and electrical devices and has a very high resolution of features compatible with such electrical and electronic devices. The light absorbing film demonstrates extremely good thermal, chemical and aging stability and may remain an integral part of an electrical or electronic device.

DESCRIPTION OF THE PREFERRED EMBODIMENT

Applicants' coating material has a very broad application. For example, it may be used to replace state of the art mask inspection systems in microelectronic photolithographic processes. Mask inspection systems allow process engineers to inspect for mask defects without taking a printer off line. Typically a glass wafer with a thin layer of chromium and a layer of photoresist are exposed in a printer. The resist is developed to provide an etch mask for the chromium and the chromium is subsequently etched. The chrome pattern on the glass wafer is compared in a mask inspection system to the original mask pattern. Inspection systems typically employ a relatively narrow band of wavelengths 450–650 nanometers for KLA instruments and 510 or 525 nanometers for Nipon Jido Seigyo instruments. Applicants' coating absorbs light at these wavelengths and furnishes sufficiently high contrast for the inspection system to operate. The coating system is patterned using a positive photoresist and developer and eliminates the need for a chrome plating and etch. It thus shortens the process time for mask inspection and allows inspection to be done without additional process equipment and without using chromium which is an environmental pollutant.

Applicants' coating can also be used to improve the performance of projection printer automatic focus systems by coating a light absorbing film on photoresist and thereby reducing the intensities of all reflected rays except that from the top surface itself. Focus is an important factor in semi-conductor and other microelectronic manufacture. Automatic focus mechanisms of projection printers typically employ a light source and a detector which senses reflected light. When light strikes the surface of the film some light is reflected and some passes through the film and is reflected at the innerface of succeeding layers. These multiple reflections can cause an automatic focus mechanism to function improperly. Applicants' coating absorbs the near infrared light emitted by the laser diodes and light emitting diodes typically used in focusing systems. It thus reduces the intensity of light reflected from all but the top surface of a multi-layer system improving the performance of automatic focus systems. Typically applicants' coating would be spin cast on top of a photoresist. When used in an automatic focusing system applicants' coating would not include the dyes which absorb the light in the blue and near ultra-violet wave lengths typically used to expose the photoresist. The coating vehicle may be water soluble or may be solvent soluble and it is stripped when the photoresist is developed. It therefore has negligible effect on the photoresist performance. The coating is applied in such a thin layer that the thickness of the coating plus the photoresist does not exceed the depth of focus limit of the optical machinery. Typically the coating would be spin cast on top of a prebaked photoresist. The coating need not be baked but may be baked if desired for example in a convection oven at 90° C. for a half hour to evaporate the solvent. The coating would be left intact during the focus and exposure steps in a projection printer and the coating would be immediately stripped when the exposed photoresist is immersed in or sprayed with an aqueous developer. In all other respects the automatic focusing process and equipment are conventional.

Applicants' material includes a polymer or a polymer precursor and soluble dyes that are effective to form a uniform, thin, tightly bonded continuous film with good insulating properties, good adhesion properties, wet and/or dry development properties with photoresist systems and which has high light absorbance in the desired wavelength range from ultraviolet through the visible and into through the infrared spectrum. The film thickness is compatible with electrical and electronic devices and the coating has high resolution required by electrical and electronic devices such as microelectronic devices. The light absorbing film also demonstrates good thermal, chemical and aging stability to remain an integral part of an electrical system. The coating material is a solution containing polyimide or polyimide precursor and required solvent soluble dyes. Because the material is not carbon or pigment filled it has very high resistivity and very high dielectric strength and does not interfer with performance of electrical or electronic devices on which it is coated. The material can be patterned by both a wet process and a dry etch. Typically the product is highly absorbing in the near ultraviolet and visible and even into the near infrared spectrum through 1000 nanometers. The material has no large particles since it is a solution and coatings are very uniform. Applicants' material adheres very well to silicon, silicon oxide and aluminum substrates. The material has extremely high thermal stability and is highly durable. Applicants' product may be used and applied in a conventional manner. For example, the material may be spun or sprayed on any conventional electrical or microelectronic substrate. For example, spinning at 4000 rpm's will typically give a film which is 5 microns thick. The material may be baked to remove solvent and to crosslink the polymer precursor. If the product is to be wet etched a positive photoresist may be spun on top. The resist is baked, exposed and developed as is conventional in the art. Applicants' light absorbing layer may develop out where the photoresist is removed and so may be patterned at the same time as the photoresist. If the material is to be dry etched a layer of aluminum or other suitable etch mask may be deposited on top of the light absorbing layer and patterned. The substrate is then placed in a chamber for a reactive ion or plasma etching and the light absorbing layer is etched out in areas not covered by the etch mask. After patterning the light absorbing layer may be baked at a higher temperature to harden the polymer.

Depending upon the method and the application the light absorbing layer may be a few microns to a few tenths of microns in thickness. Spinning typically yields films from one micron to ten microns in thickness. Conventional spraying may result in thicker films which may be as thick as twenty-five microns. Applicants' product absorbs strongly in the near ultraviolet, the visible spectrum and the visible spectrum from 200 to 750 nanometers and depending on the dye formulation may absorb strongly from 200 to 1000 nonometers. For example a five micron film of applicants' product may transmit less than one percent of all light from 200 to 750 nanometers or from 200 to about 1000 nanometers. Applicants' product is unique in that very small geometries can be patterned in it. Wet processing of a five micron thick film for example can resolve lines as small as five microns. Dry etching processing can resolve even smaller lines.

The resistivity of its light absorbing layer is $3 \times 10^{15}$ ohm-cm or more and the dielectric strength exceeds $7 \times 10^5$ volts per centimeters. These are outstanding electrical characteristics for an organic film and far better than can be expected with a polymer film filled with carbon or other pigments or any conventional material.

Some specific applications for applicants' light absorbing coating include protecting light sensitive circuitry and enhancement of contrast in liquid crystal displays, electro-luminescent displays, plasma displays and imaging systems such as charge-coupled devices for telecommunications and video cameras. Applicants' light absorbing coating may also protect light sensitive areas of light-emitting diodes, avalanche photodiodes, and solid state lasers. Applicants' product may be used to pattern apertures on light-wave modulators and other similar equipment.

The vehicle for applicants' light absorbing layer will typically include a polyimide precursor which reacts in use to form a polyimide resin. The precursor typically includes a polyamic acid prepared by reacting oxydianiline (ODA) with pyromellitic dianhydride (PMDA) or may be prepared by reacting ODA with PMDA and benzophenone tetracarboxylic dianhydride (BTDA). Other equivalent polyamic acids and polyamic precursors may be used. The reactants for the polyimide precursors are typically included in approximately stoichiometric amounts. Some formulations may include water soluble polymers such as polyvinyl/pyrrolidone and/or other conventional resins such as novalac. The dyes may be chosen from soluble organic dyes which are effective to absorb over a broad spectrum of light or from effective combinations of dyes. Exemplary dyes are as follows curcumin. Solvent Blue 45 (Savinyl Blue RLS Sandox Chemical Corporation), Solvent Red 92 (Savinyl Scarlet RLS Sandox Chemical Corporation), Solvent Blue 44 (Savinyl Blue GLS Sandox Chemical Corporation), Solvent Blue 35 (Hytherm Blue B-200% Morton Chemical), Solvent Red 111 (Morton Red AAP Morton Chemical Company), Solvent Orange 11 (Orasol Orange G Ciba-Geigy Corporation), Pylakrome Green (Pylam Products), IR-99 (American Cyanamid), IR-125 (Exciton Chemical Company) and Solvent Red 127 (TM, Sandoz Chemical Corporation). The dyes and vehicle or vehicle precursor are included with a solvent system having a low surface energy solvent so that the entire system is cosoluble. A typical solvent would include cyclohexanone.

The invention will be further understood by reference to applicants' examples included herein.

EXAMPLE 1

Using the following coating formulation:
- 58.5% polyimide precursor (ODA and PMDA)
- 7.3% N-methyl pyrrolidinone
- 21.9% cyclohexanone
- 4.4% Solvent Blue 45
- 3.4% Solvent Red 92
- 3.9% Solvent Blue 44
- 0.5% curcumin a black coating was prepared by stirring the mix for several hours. The mix was then filtered to remove undissolved material. The coating may be used as a black background contrast coating to enhance the contrast of light emitting diode and liquid crystal displays. The coating may also be used as a background coating to eliminate scatter and reflected light in detectors such as photoelectric cells and photo diodes. The coating may be coated by conventional spin or spray techniques on a substrate, baked to cure at 90° C. for 30 minutes, and at 90°–130° C. for 30 minutes, coated with photoresist, cured, exposed and developed by conventional processes. The coating may have a subsequent cure at 200° C. for 30 minutes. The coating absorbs substantially all light between 200–750 nm.

EXAMPLE 2

Using the following coating formulation:
- 58.5% polyimide precursor (ODA and PMDA)
- 7.3% N-methyl pyrrolidinone
- 21.0% cyclohexanone
- 4.0% Solvent Blue 45
- 3.4% Solvent Red 92
- 4.3% Pylakrome Green
- 0.5% curcumin a black coating was prepared, as described for Example 1.

EXAMPLE 3

Using the following coating formulation:
- 58.5% polyimide precursor (ODA, and PMDA)
- 7.3% N-methyl pyrrolidinone
- 21.9% cyclohexanone
- 4.4% Solvent Blue 35
- 3.4% Solvent Red 92
- 3.9% Solvent Blue 44
- 0.5% curcumin a black coating was prepared, as described for Example 1.

EXAMPLE 4

Using the following coating formulation:
- 57.5% polyimide precursor (ODA and PMDA)
- 7.3% N-methyl pyrrolidinone
- 21.9% cyclohexanone
- 4.4% Solvent Blue 45
- 3.4% Solvent Red 111
- 3.9% Solvent Blue 44
- 1.5% Solvent Orange 11 a black coating was prepared, as described for Example 1.

EXAMPLE 5

Using the following coating formulation:
- 58.5% polyimide precursor (ODA, BTDA, and PMDA)
- 7.3% N-methyl pyrrolidone
- 21.9% cyclohexanone
- 4.4% Solvent Blue 45
- 3.4% Solvent Red 92
- 3.9% Solvent Blue 44
- 0.5% curcumin a black coating was prepared, as described for Example 1.

EXAMPLE 6

Using the following coating formulation:
- 43.9% polyimide precursor (ODA and PMDA)
- 11.7% N-methyl pyrrolidone
- 35.2% cyclohexanone
- 3.3% Solvent Blue 45
- 2.6% Solvent Red 92
- 2.9% Solvent Blue 44
- 0.4% curcumin a black coating was prepared, as described for Example 1.

EXAMPLE 7

Using the following coating formulation:
- 57.5% polyimide precursor (ODA and PMDA)
- 7.3% N-methyl pyrrolidinone
- 21.9% cyclohexanone
- 4.4% Solvent Blue 45
- 3.4% Solvent Red 92
- 3.9% Solvent Blue 44
- 0.5% curcumin
- 1.0% IR-99 a black coating was prepared, as described for Example 1. The coating absorbs substantially all light between 200 and 1000 nm. This coating is especially useful as a background and contrast coating for light emitting diodes and sensors which operate in the near infrared range.

EXAMPLE 8

Using the following coating formulation:
- 43.9% polyimide precursor (ODA and PMDA)
- 7.3% N-methyl pyrrolidinone
- 21.9% cyclohexanone
- 4.4% Solvent Blue 45
- 3.4% Solvent Red 92
- 3.9% Solvent Blue 44
- 0.5% curcumin
- 1.0% IR-125 a black coating was prepared, as described for Example 7.

EXAMPLE 9

Using the following coating formulation:
- 56.5% polyimide precursor (ODA and PMDA)
- 7.3% N-methyl pyrrolidone
- 21.9% cyclohexanone
- 4.4% Solvent Blue 35
- 3.4% Solvent Red 111
- 3.9% Solvent Blue 44
- 1.5% Solvent Orange 11
- 1.0% IR-125 a black coating was prepared, as described for Example 7.

EXAMPLE 10

Using the following coating formulation:
- 43.1% polyimide precursor (ODA and PMDA)
- 11.7% N-methyl pyrrolidone
- 35.2% cyclohexanone
- 3.3% Solvent Blue 45
- 2.6% Solvent Red 92
- 2.9% Solvent Blue 44
- 0.4% curcumin
- 0.8% IR-125 a black coating was prepared, as described for Example 7.

EXAMPLE 11

Using the following coating formulation:
- 57.5% polyimide precursor (ODA, PMDA, BTDA)
- 7.3 N-methyl pyrrolidone
- 21.9% cyclohexanone
- 4.4% Solvent Blue 45
- 3.4% Solvent Red 92
- 3.9% Solvent Blue 44
- 0.5% curcumin
- 1.0% IR-125 a black coating was prepared, as described for Example 7.

EXAMPLE 12

Using the following coating formulation:

- 225 g Polymide precursor (ODA and PMDA)
- 27 g Novolac
- 211 ml N-methyl-pyrrolidinone
- 692 ml Cyclohexanone
- 56 g Solvent Red 127
- 56 g Solvent Red 92 a mask inspection coating was prepared by stirring the mix for several hours. The mix was then filtered to 0.45 microns to remove undissolved material. The coating may be applied by spinning or other techniques. For example, it may be spin coated to a thickness of 0.3 micron on a glass wafer and used in place of a chromium layer in a mask inspection system. A 0.3 micron film of the coating absorbs at least about 90% of the light used by mask inspection systems, about 500–600 nm.

EXAMPLE 13

Using the following coating formulation:

- 4.8 g 15K polyvinyl pyrrolidone
- 95.2 g $H_2O$
- 1.0 g IR-125 anhydro-1,1-dimethyl-2-[7[1,1-dimethyl-3-(4-sulfobutyl)-2-(1H)-benz(e)indolinylidene]-1, 3,5-heptatrienyl]-(4-sulfobutyl)-1H-benz(e)indolium hydroxide sodium salt.

an automatic focus coating was prepared by stirring the PVP in room temperature water until dissolved, about one hour. The IR-125 is added to the solution and stirred for about three hours. The solution is then filtered to remove undissolved dye and polymer. The coating may be applied by spin coating to a film thickness of 700 angstroms. The coating absorbs the light in the 650–1000 nanometer range used by automatic focus mechanisms.

It will be appreciated by those skilled in the art that variations in the invention disclosed herein may be made without departing from the spirit of the invention. The invention is not to be limited by the specific embodiments disclosed herein but only by the scope of the claims appended hereto.

We claim:

1. A broad spectrum light absorbing coating material for microelectronic photolithography consisting essentially of a polyimide precursor vehicle and at least on soluble light absorbing dye in a solvent system, the dye being substantially completely soluble in the solvent and vehicle system and being effective to absorb substantially all light across a broad spectrum of light, from in the ultra violet spectrum to in the infra red spectrum, when the coating is coated on a microelectronic photolithographic substrate, the coating system having a high electrical resistivity and a high dielectric strength when coated on a substrate, and being effective to provide a uniform, tightly adhering coating, the coating being photolithographically imagable and effective to produce microelectronic images having fine line resolution and being developable and etchable by wet and dry etch microelectronic photolithography processes, the coating having a high specific absorptivity over a broad spectrum of light effective to provide a substantially black coating.

2. The light absorbing coating material of claim 1 wherein the vehicle is selected from the group consisting of polyamic acids.

3. The light absorbing coating of claim 2 wherein the vehicle is selected from the group consisting of oxydianiline and pyromellitic dianhydride or oxydianiline, pyromellitic dianhydride and benzophenone tetracarboxylic dianhydride, the vehicle components being present in approximate stoichiometric amounts.

4. The light absorbing coating material of claim 1 wherein the coating material is effective to absorb substantially all light in the range of about 200 to 750 nanometers, when coated on a substrate.

5. The light absorbing coating material of claim 1 wherein the coating material is effective to form a high contrast coating and wherein the dye is selected from the group consisting of curcumin, Solvent Blue 45, Solvent Red 92, Solvent Blue 44, Solvent Blue 35, Solvent Red 111, Solvent Orange 11, Pylakrome Green, IR-99, anhydro-1, 1-dimethyl -2-[7[1,1-dimethyl-3-(4-sulfobutyl)-2-(1H)-benz(e) indolinylidene]-1,3,5-heptatrienyl]-(4-sulfobutyl)-1H-benz(e) indolium hydroxide sodium salt and Solvent Red 127 and mixtures thereof.

6. The light absorbing coating material of claim 1 wherein the coating has an electrical volume resistivity of at least about $3 \times 10^{15}$ ohm-cm, when coated on a substrate.

7. The light absorbing coating material of claim 1 wherein the coating has a dielectric strength of at least about $7 \times 10^5 V/cm$, when coated on a substrate.

8. A light absorbing coating material for improving the performance of automatic focus equipment used in microelectronic photolithography consisting essentially of at least one soluble light absorbing dye in a vehicle and solvent system, the dye being effective to absorb substantially all unreflected light, from about 200 to about 1000 nanometers across the spectrum used in automatic focus processes, when coated on a microelectronic substrate, and being effective to provide a thin, uniform coating, the coating being compatible with subsequent processing of the microelectronic substrate including being readily removable by subsequent processing of the microelectronic substrate.

9. A light absorbing coating material for mask inspection systems used in microelectronic photolithography consisting essentially of at least one soluble light absorbing dye in a vehicle and solvent system, the dye being effective to absorb substantially all light across the spectrum used in microelectronic photolithography mask inspection systems, from about 200 to about 1000 nanometers, and being photolithographically imagable and developable in the mask inspection process, the coating being effective to provide a thin, uniform, coating and being effective to produce images having fine line resolution when used in a microelectronic photolithographic mask inspection system.

10. The automatic focus equipment light absorbing material of claim 8 wherein the vehicle is selected from the group consisting of polyimide precursors.

11. The light absorbing coating of claim 8 wherein the vehicle is selected from the group consisting of oxydianiline and pyromellitic dianhydride or oxydianiline, pyromellitic dianhydride and benzophenone tetracarboxylic dianhydride, the vehicle components being present in approximate stoichiometric amounts.

12. The light absorbing coating of claim 8 wherein the coating material is effective to absorb substantially all light in the range of about 650 to 1000 nanometers.

13. The automatic focus light absorbing coating of claim 8 wherein the dye is anhydro-1,1-dimethyl-2-[7[1,1-dimethyl-3-(4-sufobutyl)-2-(1H)-benz(e)indolinylidene]-1,3,5-heptatrienyl]-(4-sulfobutyl)-1H-benz(e)indolium hydroxide sodium salt.

14. The light absorbing coating of claim 8 wherein the coating has an electrical volume resistivity of at least about $3 \times 10^{15}$ ohm-cm and a dielectric strength of at least about $7 \times 10^5$ v/cm, when coated on a substrate.

15. The mask inspection light absorbing material of claim 9 wherein the vehicle is selected from the group consisting of polyimide precursors.

16. The light absorbing coating of claim 15 wherein the vehicle is selected from the group consisting of oxydianiline and pyromellitic dianhydride or oxydianiline, pyromellitic dianhydride and benzophenone tetracarboxylic dianhydride, the vehicle components being present in approximate stoichiometric amounts.

17. The light absorbing coating of claim 9 wherein the coating material is effective to absorb substantially all light in the range of about 500 to 600 nanometers.

18. The light absorbing coating of claim 9 wherein the dye is selected from the group consisting of solvent red 127, solvent red 92 and mixtures thereof.

19. The light absorbing coating of claim 9 wherein the coating has an electrical volume resistivity of at least about $3 \times 10^{15}$ ohm-cm and a dielectric strength of at least about $7 \times 10^5$ v/cm, when coated on a substrate.

20. A broad spectrum light absorbing coating material for microelectronic photolithography consisting essentially of a polyimide precursor vehicle and at least one soluble light absorbing dye in a solvent system, the dye being substantially completely soluble in the solvent and vehicle system and being effective to absorb substantially all light across a broad spectrum of light, from about 200 nanometers to about 1000 nanometers, when the coating is coated on a microelectronic photolithographic substrate, the coating system having a high electrical resistivity and a high dielectric strength when coated on a substrate, and being effective to provide a uniform, tightly adhering coating, the coating being photolithographically imagable and effective to produce microelectronic images having fine line resolution and being developable and etchable by wet and dry etch microelectronic photolithography processes, the coating having a high specific absorptivity over a broad spectrum of light effective to provide a substantially black coating.

* * * * *